United States Patent [19]
Marchal et al.

[11] Patent Number: 5,832,469
[45] Date of Patent: Nov. 3, 1998

[54] ELECTRONIC SYSTEM ORGANIZED AS A MATRIX NETWORK OF FUNCTIONAL CELLS

[75] Inventors: Pierre Marchal, Valangin; Christian Piguet, Neuchatel; Pascal Nussbaum, Cortaillod, all of Switzerland

[73] Assignee: C.S.E.M.—Centre Suisse d'Electronique et de Microtechnique SA, Grenchen, Switzerland

[21] Appl. No.: 844,729

[22] Filed: Apr. 21, 1997

[30] Foreign Application Priority Data

Apr. 26, 1996 [FR] France ................................. 96 05320

[51] Int. Cl.⁶ ..................................................... G06E 1/00
[52] U.S. Cl. .................................................. 706/15; 706/16
[58] Field of Search .................................. 706/10, 15, 16, 706/25, 26

[56] References Cited

U.S. PATENT DOCUMENTS 5,508,636  4/1996  Mange et al. .............................. 326/38

FOREIGN PATENT DOCUMENTS 0626760  11/1994  European Pat. Off. .
9517781  6/1995  WIPO .

OTHER PUBLICATIONS

P. Marchal, et al., "Achieving Von Neumann's Dream: Artificial Life on Silicon", International Conference on Neural Network/World Congress on Computational Intelligence, Orlando, Jun. 27–29, 1994, vol. 4, Jun. 27, 1994, pp. 2321–2326.

*Primary Examiner*—Taric R. Hafiz

[57] ABSTRACT

In this network (R) all the cells have identical construction. Each cell is assigned a code word which defines its function which it is to provide for within the network. With a view to the configuring of the cells (Cx,y), means (1) iteratively cause the translation into each of the cells of a genome formed of a train of the successive code words.

The network comprises at least one individualized functional organ (O1, O2, O3, ...) composed of a plurality of cells which are all characterized by a first predetermined code (<MHC>) forming part of said code word and formed by a number identifying the organ (O1, O2, O3, ...) so that these cells can collectively provide for the functionality of this organ. The cells of the latter are distributed as internal cells defined by a first predetermined value of a status code also forming part of the code word, and as membrane cells defined by a second predetermined value of the second code. The internal cells provide for the functionality of the organ and the membrane cells (MO1, MO2, MO3, ...) are capable of functionally isolating the internal cells from the remainder of the network and of providing for the communication of these internal cells with the remainder of the network.

7 Claims, 16 Drawing Sheets

FIG.15.B

ELECTRONIC SYSTEM ORGANIZED AS A MATRIX NETWORK OF FUNCTIONAL CELLS

TECHNICAL FIELD OF THE INVENTION

The present invention relates to programmable integrated electronic systems which include, in order to carry out their functionalities, a matrix network of cells, all identical and configurable in respect of the functions which they are to accomplish.

Such systems, the principle of which is already known, may be endowed with various intrinsic cell fault tolerance functions by virtue of their capacity to adapt themselves to the fault so as to be able to perpetuate their functionalities.

BACKGROUND OF THE INVENTION

A network of this type is described in European Patent Application No. 94.81 0292.6 filed on 5 May 1994 in the name of the Applicant and entitled: "Système électronique organisé en réseau matriciel de cellules" (Electronic system organized as a matrix network of cells). In this system, cells are grouped together as a network which includes means for propagating a "genome" composed of "genes" through the cells of the network so as to activate them in respect of the functions which they are to fulfill in the system. Here, "gene" is understood to mean a binary code word comprising all the information required in order to place a given cell in the desired functional configuration.

SUMMARY OF THE INVENTION

The purpose of the invention is to improve the network described in the aforesaid patent application so as to reduce the size of the genome, decrease the influence of faults by limiting them to the organ affected and, more generally, to allow better flexibility of organization of the functions which have to be carried out by the network.

The subject of the invention is therefore a matrix network composed of cells all of identical construction and in which network each cell is assigned a code word which defines its function which it is to provide for within the network, said network including means which, with a view to the configuring of the cells, iteratively cause the translation into each of said cells of a genome formed of a train of said successive code words, wherein it comprises at least one individualized functional organ composed of a plurality of said cells which are all characterized by a same first predetermined code forming part of said code word and formed by a number identifying said organ so that these cells can collectively provide for the functionality of said organ, said cells of the organ being distributed as a first group of so-called internal cells defined by a first predetermined value of a second code or status code also forming part of said code word, and a second group of so-called membrane cells defined by a second predetermined value of said second code, said first group of cells providing for the functionality of said organ and said second group of membrane-forming cells being capable of functionally isolating said first group of cells from the remainder of the network and providing for the communication of this first group of cells with the remainder of said network.

It follows from these characteristics that the cells of the functional organ can be configured and identified using a relatively small volume of information, thus making it possible to reduce the size of the genome required to configure the network. Moreover, it becomes possible to provide for better flexibility of management of functionality inside each organ especially through the self-repair capability with which a functional organ can be endowed.

BRIEF DESCRIPTION OF THE DRAWINGS

Other characteristics and advantages of the invention will emerge in the course of the description which follows, given merely by way of example and made while referring to the appended drawings in which:

FIGS. 15A, 15B and 16C show for certain cells of the functional organ how its growth terminates.

DETAILED DESCRIPTION OF THE INVENTION

In the present description, the expressions listed below have the following meanings:

| | |
|---|---|
| Genome | Train of code words cyclically traversing all the cells of the matrix network and from which the cells determine their functionality. |
| Gene | That part of a code word of the genome which is assigned respectively to each cell in order to put in place the function which it is to fulfill. |
| Organ | Set of a certain number of cells of the network which are assigned to a given task. |
| Membrane | Group of particular cells which encircle the functional cells of an organ in the network and form part of said organ. |
| Global address | Part of a code word defining the location of a cell in the network. |
| Local address | Part of a code word defining the location of a cell in an organ of the network. |
| Header | Part of a code word containing a status code. |
| Zygote | Basic cell of an organ whose global address determines the location from which the growth of an organ in the network develops. |

Moreover, the terms "West" and "South" (and possibly, "North" and "East") used hereinafter here designate, arbitrarily and for the convenience of the description, the directions in the matrix network, containing a very large number of cells which are to be represented lying in a plane and situated in the manner of road maps for example, along the cardinal directions of the wind rose.

It will be understood however that the physical disposition of the network according to the invention may differ from this planar arrangement, it being possible for the various parts of the network to be made, for example, on several integrated circuit chips arranged according to any design depending on need. It is also possible on the basis of the concept of the invention to design three-dimensional networks entailing appropriate addressing.

However, in order to describe the invention, here examination will merely be made of a matrix network R according to the invention (FIG. 1) designed as a two-dimensional network. It therefore includes a plurality of juxtaposed cells, all identical and disposed in the example along two perpendicular axes X and Y. Thus, each cell is assigned a global address consisting of an X value and a Y value.

The network R is controlled by a processor P which allows the network to be configured on initialization, to be reconfigured as needed during the operation thereof and, possibly, to allow control and cue signals to be exchanged with it, relating to the tasks which the network is to accomplish in the course of its operation.

Figure 1:
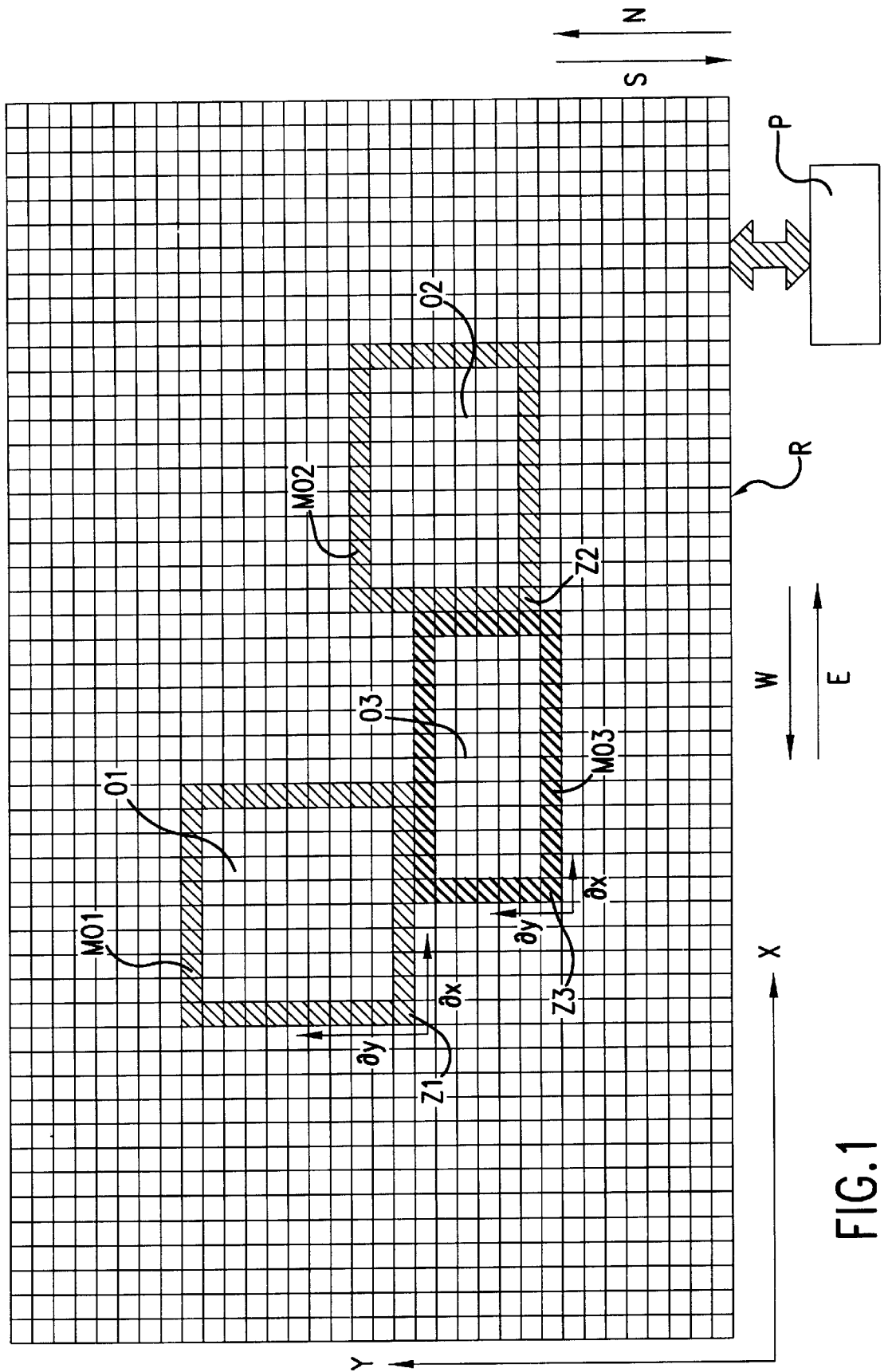
FIG. 1 is a very simplified diagram of a network according to the invention.

According to the invention, after initialization, the network R exhibits a certain hierarchy among the cells. Thus, functional organs are delimited therein through the configuring of the cells upon initialization. Represented by way of example in FIG. 1 are three of these organs O1, O2 and O3, this number obviously being in no way limiting.

Each of these organs O1, O2, O3. On has the property of being organically distinct from the other organs and/or cells of the network and of thus forming an autonomous functional entity capable of accomplishing a specified function, of exchanging electrical signals with the remainder of the network and/or with the processor P, and of itself undertaking the management of faults which may impair the cells of which it is composed.

In each organ, the cells also exhibit a hierarchy among themselves. Thus, each organ includes a zygote, Z1, Z2, . . . , Zn, which is the basic cell of the organ from which, especially on initialization of the network, the organ will be developed. Each organ also comprises a group of cells, as MO1, MO2, . . . , MOn, forming what is called a membrane hereafter in the description. A membrane surrounds an organ so as thus functionally to isolate it from the remainder of the network R. The membrane cells are configured (that is to say functionally organized), with the help of the gene to which they correspond, in such a way as to allow them to provide for exchange with the exterior (that is to say with the remainder of the network and/or with the processor P).

In each organ, the cells are assigned a local address which defines the siting thereof in this organ with respect to the zygote Z1, Z2, . . . , Zn of the latter. The code words corresponding to these cells therefore contain no address value corresponding to their global address.

Determination of the functionalities of the cells is carried out by means of a genome which the processor P can send to the network R. This is a train of binary signals distributed into code words assigned respectively to the cells. Each code word includes a group of signals forming the gene of a cell. Each gene contains all the signals or cues for configuring the cell (that is to say fixing its functionality) for which it is intended. According to the invention, each code word includes in particular:

1) a status cue which, in particular, tags the category of the corresponding cell. This cue is also used to organize the cell functionally and to advise on its state, 2) a membership cue defining the organ number to which the relevant cell belongs, 3) global and/or local addresses, and 4) a cue (or gene) defining, if it is present, the functionality of the cell corresponding to the local address specified in the code word.

To initialize the network R, the genome has to traverse all its cells which, in the embodiment example which will be described below, is performed serially by shifting the genome into the cells under the action of a general clock signal (not represented) which is supplied by the processor P.

A code word of the network according to the invention takes the following form:

<status><code MHC><@X><@Y><δx><δy><gene> in which <status> defines the status cue of the cell, <code MHC> (an acronym borrowed from cell biology standing for "Major Histocompatibility Complex") the membership cue for a given organ, <@X> and <@Y> the global address of the cell, <δx> and <δy> its local address and, finally, <gene> the functionality of this cell. It should be noted that the gene serves to configure the cell, preferably, in the manner described in the aforesaid patent application. Therefore, this will not be returned to in the present description.

Figure 2:
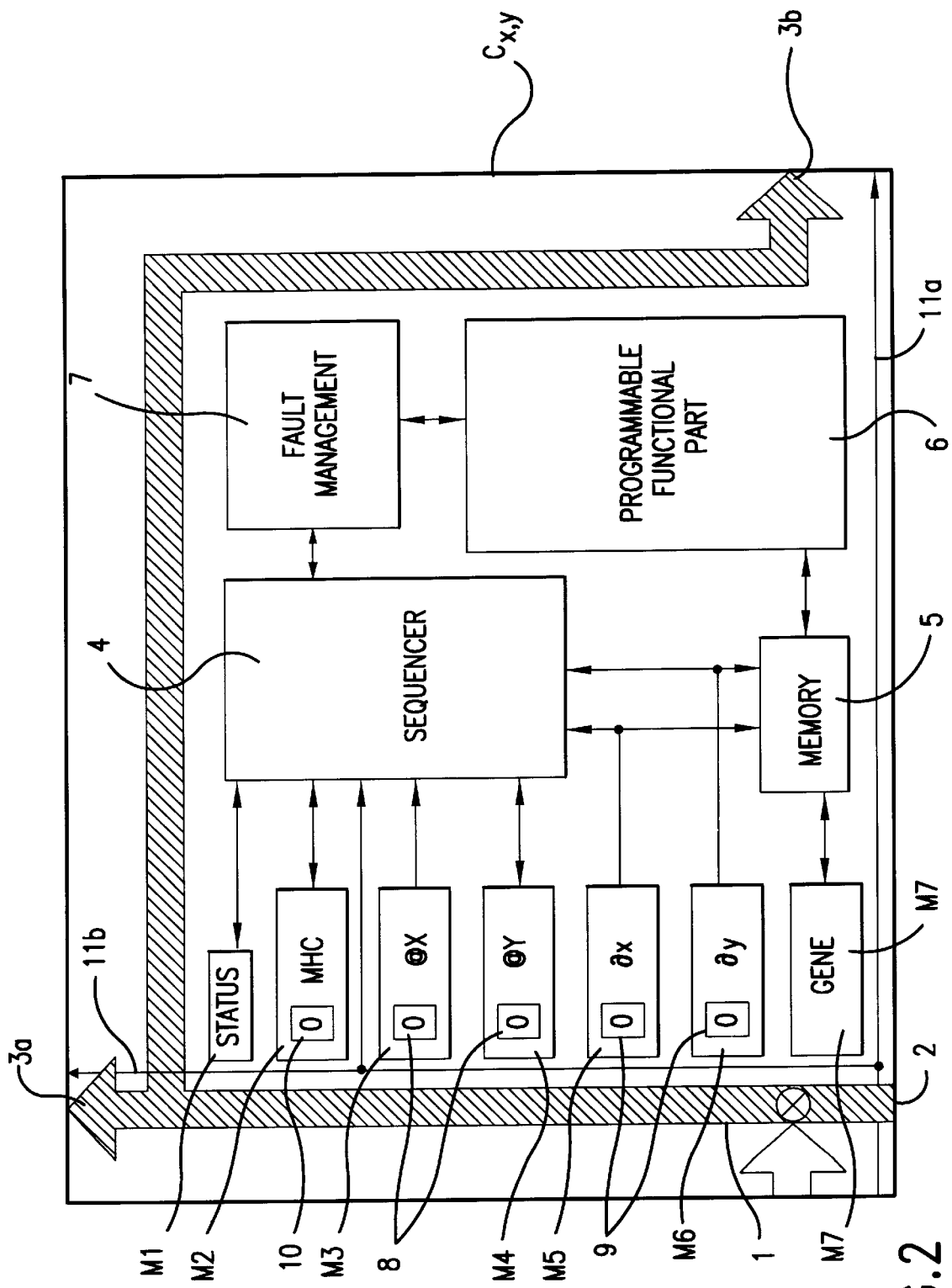
FIG. 2 is the general diagram of a cell of the network of FIG. 1.

FIG. 2 represents a very simplified diagram of a cell of the network R according to the invention. It is denoted by the general reference Cx,y. All the cells of the network have the same construction.

The cell includes a shift register 1 through which the genome can be conveyed. In the embodiment described, this conveyance is serial and is carried out under the control of the clock signal generated by the general clock located in the processor P.

The shift register 1 has its input 2 which communicates with the output of the shift register of the South and West cells and includes two outputs 3a and 3b communicating, respectively, with the inputs of the shift registers of the North and East cells.

The settings of the shift register 1 are logically in communication with logic analysis modules which are responsible for examining the genome transferred in the register 1 and to extract therefrom the cue intended for the relevant cell.

These modules are:
a status module M1 in which the status code is analyzed;
an MHC module M2 in which the organ number code is analyzed;
a module M3 with global address @X;
a module M4 with global address @Y;
a module M5 with local address δX;
a module M6 with local address δY; and
a gene module M7.

The cell includes a sequencer 4 responsible for implementing the various phases of the sequencing, as will become apparent hereafter in the description. The cell includes, furthermore, a module 5 in which may be stored the genes of all or some of the other cells of the organ. The cell also includes a programmable functional part 6 operating, preferably, in the manner described in the aforesaid patent application. Therefore, this will not be returned to in the present description.

The cell furthermore includes a part 7 dedicated to the management of faults which will receive the error signals originating from the various blocks constituting the cell while operating preferably in the manner described in the aforesaid patent application. Therefore, this will not be returned to in the present description. Finally, each cell comprises registers 8 and 9, respectively, for global and local addresses, as well as an MHC code register 10.

The creation of a functional organ O in the network R will now be examined by describing, along with the unfurling of the creation process, the circuits which are required in each cell, for the implementation of this process.

Figure 3:
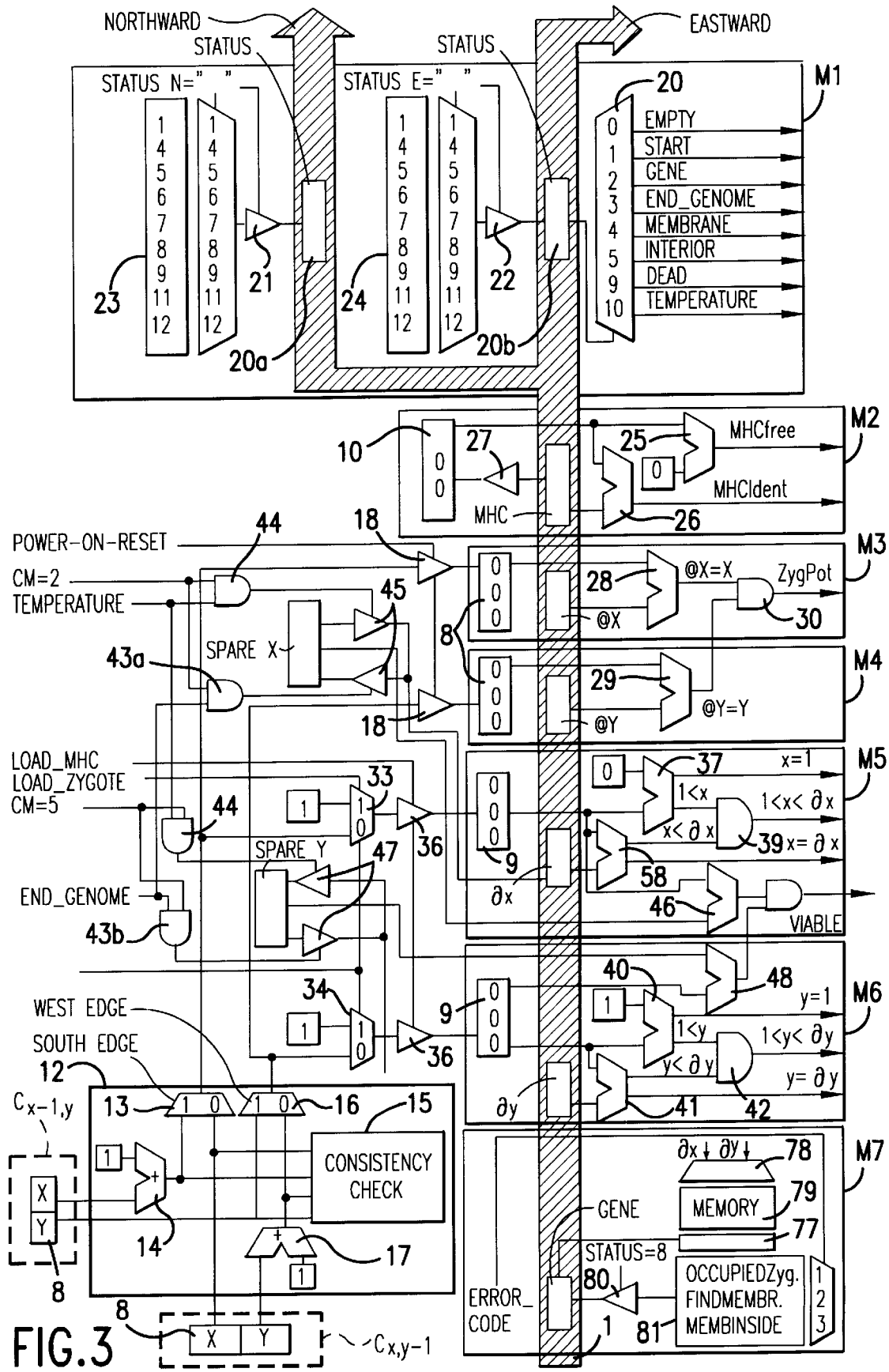
FIGS. 3, 3A and 3B are more detailed diagrams of a cell of the network according to the invention.
Figure 3A:
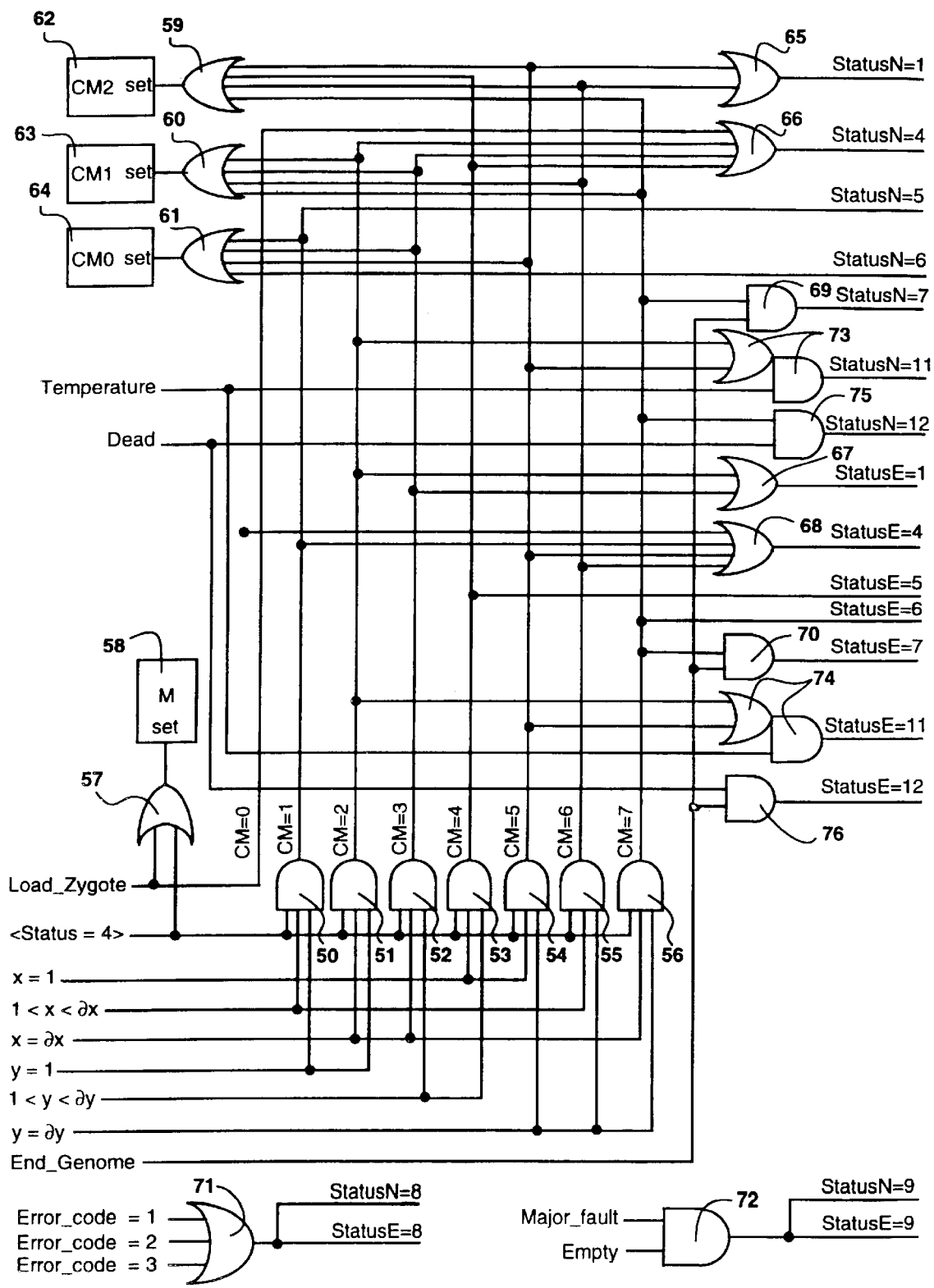
Figure 3B:
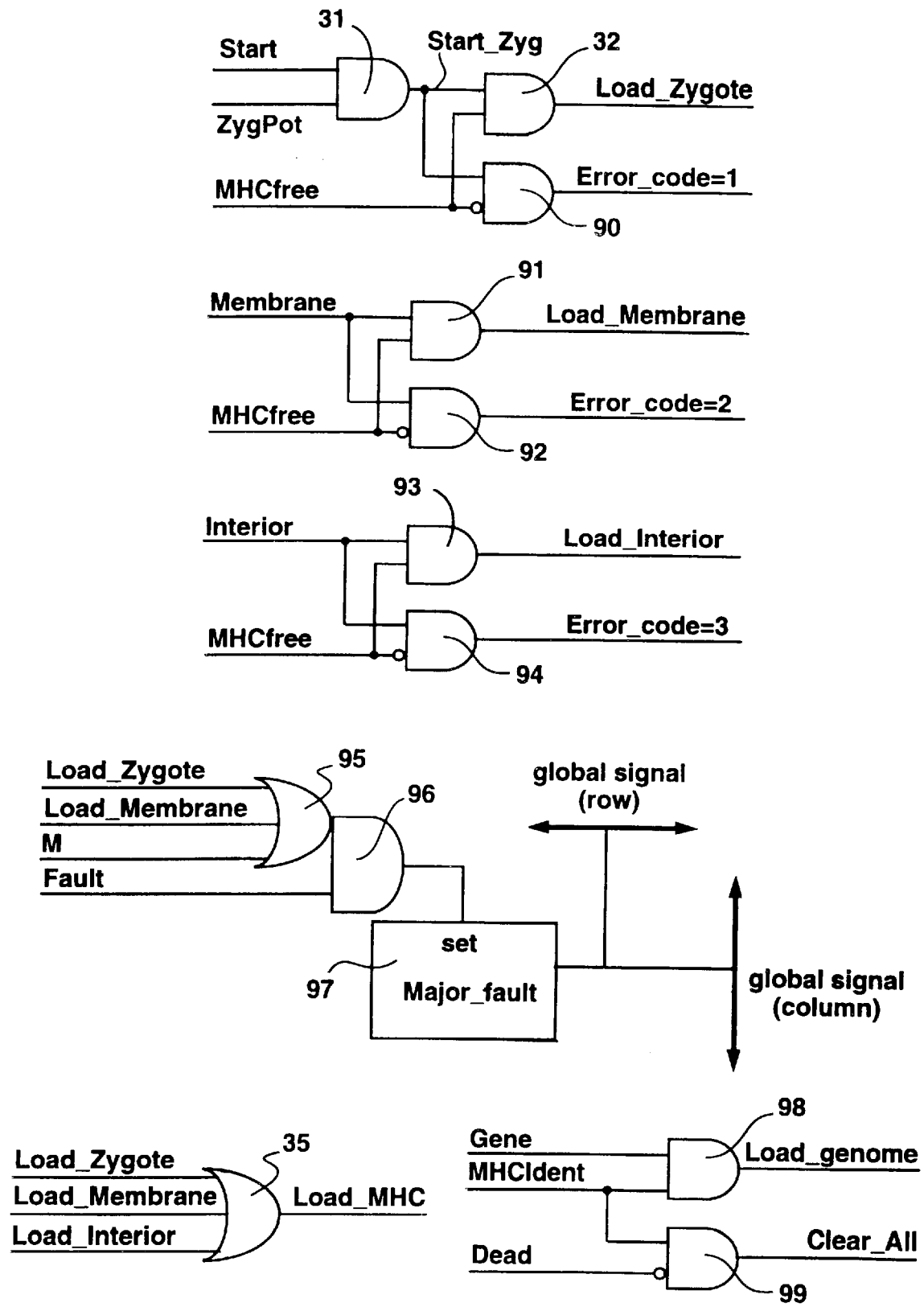

Represented in FIGS. 3, 3A and 3B is a simplified diagram of an embodiment example of such circuits forming part of the cell Cx,y, it being understood that they are to be found identically in all the cells of the network R. Some of these circuits belong to the sequencer 4, others to the logic blocks M1 to M7 or to the module 5 of the cell.

One of the circuits, represented globally as 12 in FIG. 3, is responsible, during start-up of the circuit (Power-On-Reset signal), for calculating the global address @X and @Y of the cell Cx,y, and then during the loading of an organ, the same circuit is used to calculate the local address δX and δY of the cell Cx,y. In the embodiment represented, which is not limiting of the invention, computation of the global addresses is advantageously performed by using a redundancy method which makes it possible to check the transfers and the computations of the values of the addresses for all the cells. Computation can be performed in series or in parallel.

Figure 4:
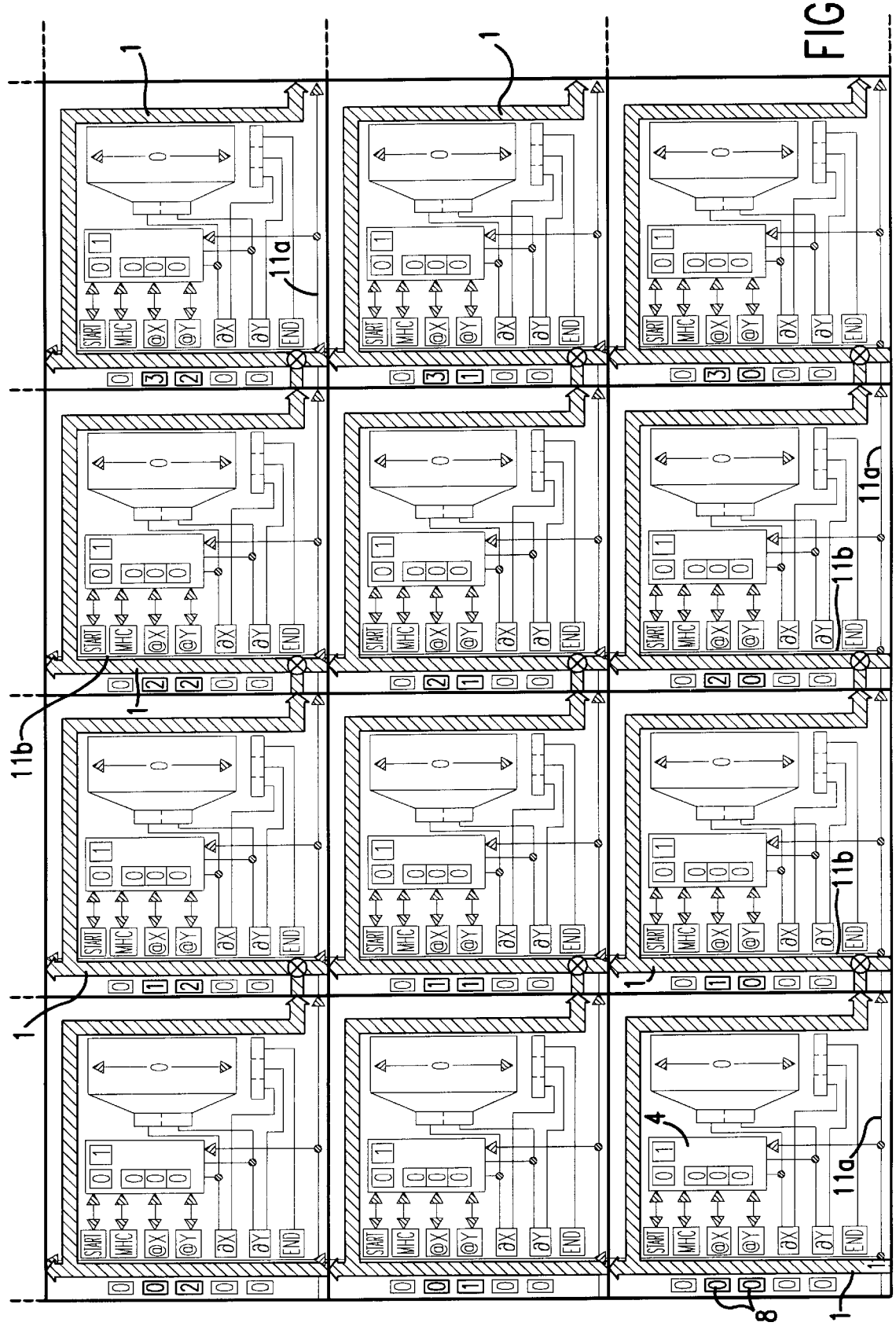
FIG. 4 shows a part of the network according to the invention so as to illustrate the process for configuring the cells.

Computation of the global addresses is triggered, on initializing the network R, by the processor P (FIG. 1) which produces, for this purpose, a signal for resetting to the initial state (Power-On-Reset). This signal prompts computation of the address of the "first" cell of the network which, in the example, has address 0,0 (FIG. 4). Computation of the global addresses is performed subsequently one by one in all the cells as follows.

The global address of the cell Cx,y is computed from those of the adjacent cells Cx-1,y and Cx,y-1, only the global address registers 8 of which have been represented in FIG. 3. The circuit 12 comprises, for the loading of the X value of the global address, a multiplexer 13 controlled by the signal SouthEdge. The "1" input, enabled when the signal SouthEdge=1, of this multiplexer receives the value of an incrementer 14 which is linked to the part X of the register 8 of the cell Cx-1,y. The "0" input of the multiplexer 13, enabled when the signal SouthEdge=0, is linked to the part X of the register 8 of the cell Cx,y-1. In the general case, the register of the global address receives the corresponding value of the South cell (Cx,y-1) except on the South edge of the circuit (Y=0) for which there is no South cell. In the latter case, the computation is carried out starting from the West cell (Cx-1,y) and then requires an incrementation (by virtue of the incrementer 14). The two values of X are dispatched to the block 15 for checking consistency. If the two values are different, there is an anomaly in the transfer of the addresses or in the computation. By virtue of this redundancy of the address computation, the processor P can, by means which are not described here, take measures to remedy an anomaly, possibly by discarding in functional terms from the network the cell in which the error has been observed.

The computation of the Y address unfurls in an entirely similar manner in the cell Cx,y, through the loading of the part Y of the register 8 of the cell Cx,y, by means of the multiplexer 16 controlled by the signal WestEdge, except for the first column (WestEdge=1) in which case it is loaded with the value originating from the incrementer 17 which is linked to the part Y of the register 8 of the cell Cx,y-1.

The values of the signals SouthEdge and WestEdge may, for example, be defined upon construction of the network or by the processor P.

FIG. 4 shows the extreme South-West part of a network R in which the cells have been loaded with their global address, the initial address of the extreme South-West cell here being chosen with the value 0,0.

FIG. 4 also shows the very first operation in the step of the process for creating the organs of the network, which step will unfurl immediately after the loading of the global addresses into the cells, namely the transit of the genome through the registers 1 of all the cells. The step is triggered by the sending of a signal which is sent by the processor P upon completion of the loading of the global addresses and is transferred from cell to cell over conductors 11a and 11b located in each cell (see also FIG. 2). This signal triggers the operation of the sequencers 4 of all the cells.

More particularly, FIG. 4 shows the situation at the end of the first clock cycle of this step. It can be seen therefore that the shift register 1 of the cell with global address 0,0 has received the first digit of the genome which here has the value "1". At the same time, the cycle counters of all the cells display the setting "1". Apart from the shift register 1 of cell 0,0, which has received the first digit, the other shift registers are still empty.

The functional organ, the formation of which will be described by way of example, exhibits the code words listed in Table 1 below. (It should be noted that the values are given in decimal notation to aid understanding. In reality, the code words of the genome are, preferably, in binary notation).

TABLE 1

| No. | Status | MHC | <@X> | <@Y> | <δx>, <x> or <SPARE> | <δy>, <y> or <SPARE> | Gene |
|---|---|---|---|---|---|---|---|
| 1 | <1> | <23> | <001> | <001> | <04> | <03> | <xx> |
| 2 | <2> | <23> | <—> | <—> | <01> | <01> | <gene 1> |
| 3 | <2> | <23> | <—> | <—> | <02> | <01> | <gene 2> |
| 4 | <2> | <23> | <—> | <—> | <03> | <01> | <gene 3> |
| 5 | <2> | <23> | <—> | <—> | <04> | <01> | <gene 4> |
| 6 | <2> | <23> | <—> | <—> | <01> | <02> | <gene 5> |
| 7 | <2> | <23> | <—> | <—> | <02> | <02> | <gene 6> |
| 8 | <2> | <23> | <—> | <—> | <03> | <02> | <gene 7> |
| 9 | <2> | <23> | <—> | <—> | <04> | <02> | <gene 8> |
| 10 | <2> | <23> | <—> | <—> | <01> | <03> | <gene 9> |
| 11 | <2> | <23> | <—> | <—> | <02> | <03> | <gene 10> |
| 12 | <2> | <23> | <—> | <—> | <03> | <03> | <gene 11> |
| 13 | <2> | <23> | <—> | <—> | <04> | <03> | <gene 12> |
| 14 | <3> | <23> | <—> | <—> | <04> (SPARE) | <03> (SPARE) | <xxxxx> |

Figure 5:
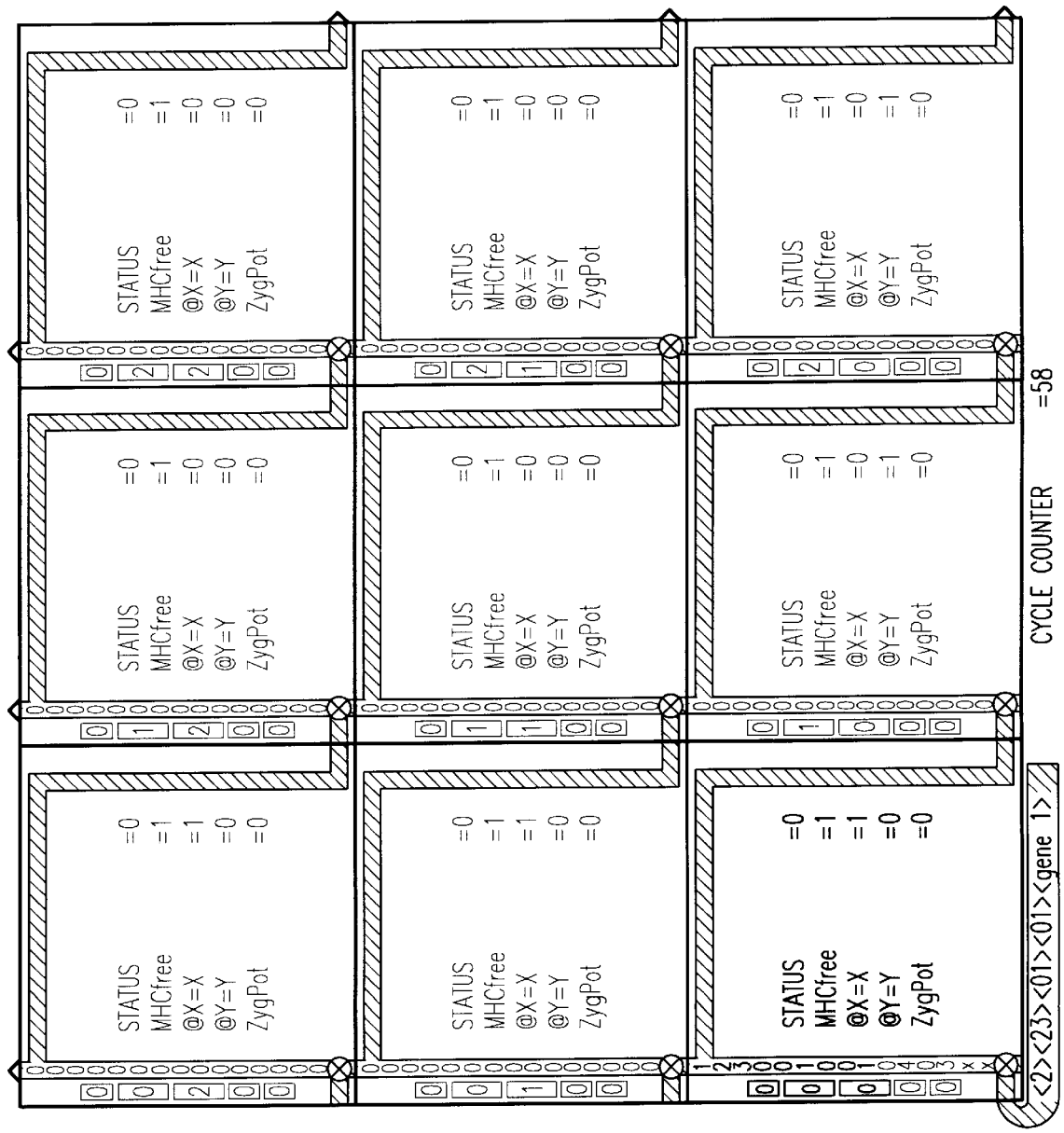
FIGS. 5, 6 and 7 show views similar to that of FIG. 4 respectively after the elapsing of 58, 116 and 174 cycles of a clock controlling the configuring of the cells.

Represented in FIG. 5 is the part of the network containing the nine cells located in its extreme South-West corner. The cell with address 0,0 has just received the first code word in full which, in the example, requires 58 clock cycles. Under these conditions, the status code of this code word is located, in the shift register 1, at a position which allows it to be analyzed by the module M1 of the cell with address 0,0. As represented in FIG. 3, the logic module M1 comprises a decoder 20 which delivers the sequencer control signals as a function of the various values of the code <status>. For example, when <status> equals 1, the command START is produced. The possible commands are summarized in Table 2 below:

TABLE 2

| <status> | Signal generated |
|---|---|
| 0 | EMPTY |
| 1 | START |
| 2 | GENE |
| 3 | END_GENOME |
| 4 | MEMBRANE |
| 5 | INTERIOR |
| 9 | "DEAD" |
| 10 | "TEMPERATURE" |

The logic module M1 also includes two loading control elements 21 and 22 which make it possible to modify the status code destined, respectively, for the North and East neighbor cells of the cell Cx,y. When the status code is loaded into the cell Cx,y, two status registers 20a and 20b receive a copy of the status code. Each register may, or may not, be modified, independently of the other, on the basis of the contents of two memories of constants 23 and 24, depending on the value of the loading signals StatusN="" and StatusE="".

The logic module M2 includes a comparator 25 receiving, on one of its inputs, the MHC code of the register 10 and, on the other input, the value "0". This comparator 25 delivers a logical "1" (signal MHCFree at "1") at its output when the values applied to its inputs are both equal. This signifies that the cell is still free.

The logic module M2 also includes a comparator 26 receiving, on one of its inputs, the code MHC of the register 10, and, on the other input, the value originating from the code MHC being conveyed through the shift register 1. This comparator 26 delivers a logical "1" (signal MHCIdent at "1") at its output when the values applied to its inputs are both equal. This signifies that the code word is compatible with the organ.

The module M2 includes, furthermore, a loading control element 27 which allows the loading of the register 10 with the MHC organ number as a function of the signal Load_MHC (FIG. 3).

The global addresses @X and @Y of the code word No. 1 have, respectively, the values 001 and 001. When these values are respectively made to coincide in the shift register 1 of the cell with address 0,0, the modules M3 and M4 of this cell analyze these values with the help of the comparators 28 and 29. The latter include a first input receiving the global (respectively, X and Y) address during the loading of the global addresses which was described earlier. In this instance, these comparators are designed to deliver a logical "1", when there is equality between the values applied to their inputs, and to deliver logical "0"s when the value of the global address loaded and that of the code word differ.

It will be observed in FIG. 3 that the outputs of the comparators 28 and 29 are logically combined in an AND gate 30 delivering a signal ZygPot on its output in the event of the equality of the address values just mentioned. In the example, the three output signals from the comparators 28 and 29 and from the AND gate are at zero in the cell with address 0,0 upon transit of the first code word (see FIG. 5).

Figure 6:

FIG. 5 also shows that code word No. 2 is getting ready to enter the shift register 1 of the cell with address 0,0. During the next 58 clock cycles, code word No. 1 will propagate into the East and North cells whilst the cell with address 0,0 receives code word No. 2. After 116 clock cycles, the situation is then as represented in FIG. 6, wherein appear the states of the signals supplied by the modules M1 to M4 of the relevant cells. Codeword No. 3 is at the input of the shift register 1 of the cell with address 0,0.

Figure 7:
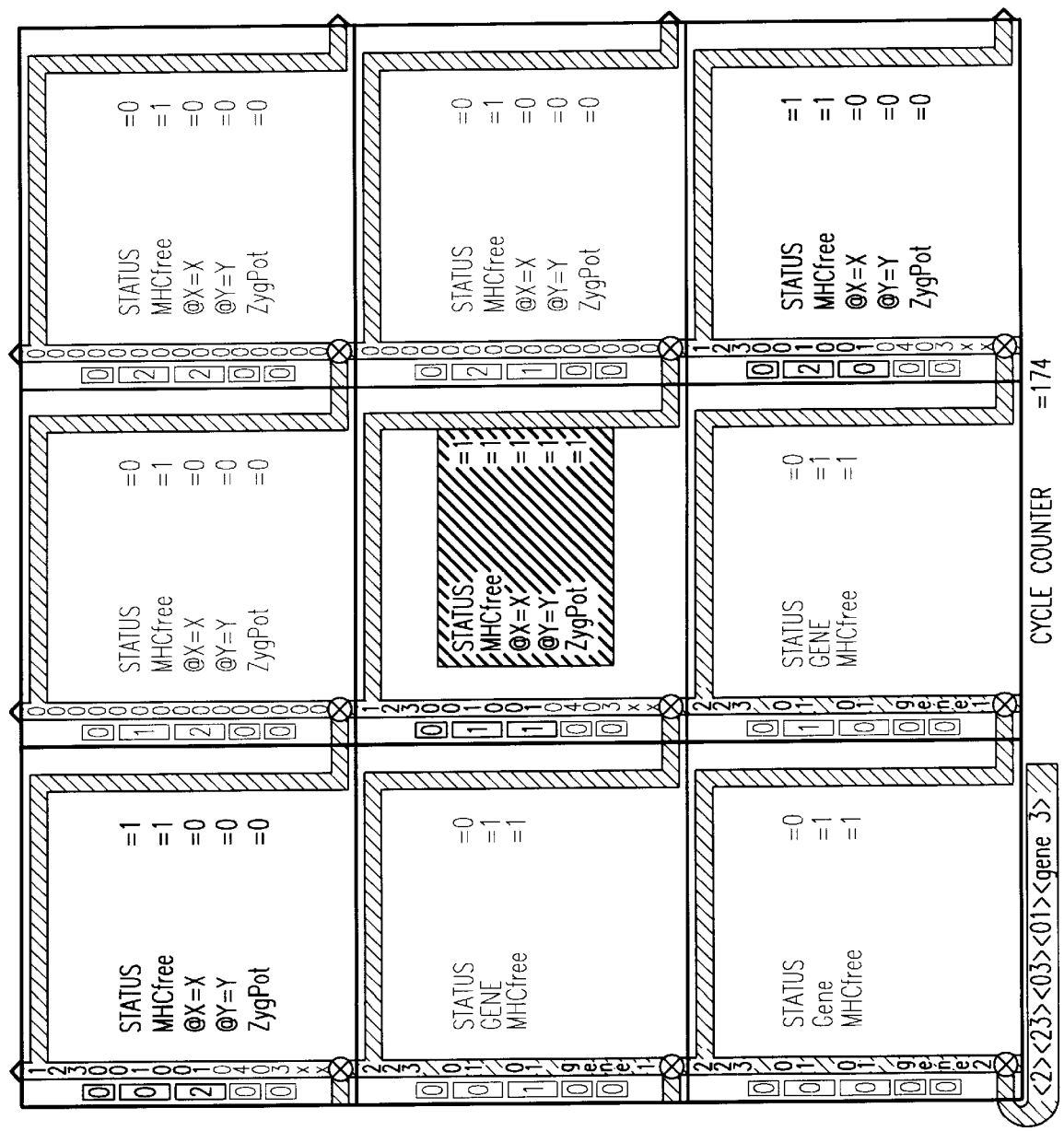

FIG. 7 represents the situation when 174 clock cycles have elapsed. It can be seen that code word No. 1 is located in the cells having the global addresses 1,1, 0,2 and 2,0, code word No. 2 is located in the cells having the global addresses 0,1 and 1,0 and code word No. 3 is located in the cell with global address 0,0.

The entry of code word No. 1 will prompt a change in the cell with address 1,1. Thus, in this cell, the global address corresponds to the global address codes contained in this code word, so that the comparators 28 and 29 now deliver a logical "1" at their output. This will give rise to a logical "1" at the output of the AND gate 30 (ZygPot at "1"). Three conditions are thus simultaneously fulfilled in respect of this cell; in the example described here, this signifies that the cell in question is the zygote for the functional organ being loaded into the network. As far as the other cells are concerned, it may be seen in FIG. 7 that nothing has changed with regard to them, as shown by the indicated state of the signals in the relevant cells. Moreover, code word No. 4 is getting ready to enter the cell with address 0,0.

In the cell with global address 1,1 which will henceforth be called the zygote, the logical "1" states of the two signals START (<status>) and ZygFot prompt the triggering of an AND gate 31 (FIG. 3B), whose output Start_Zyg signifies that the zygote corresponding to the genome being loaded has been found. This signal, combined with the "1" state of the signal MHCfree, prompts the triggering of an AND gate 32 whose output is the signal Load_Zygote, which signifies that the potential zygote is free and that it can be loaded. This signal forms together with the signals Load_Membrane and Load_Interior the cases of loading of the MHC, as carried out by the OR gate 35 which supplies the signal Load_MHC triggering the entire membrane creation operation and, in particular, the loading of the register with MHC by virtue of the loading element 27.

The sequencer of each cell comprises a set of logic gates (FIG. 3A), making it possible:

to generate the membrane code stored in the flip-flops 62 (CM2), 63 (CM1) and 64 (CMO), to initialize the membrane flip-flop M 58, and to generate the signals for modifying the status code for transmission to the North and East neighbor cells (StatusN and StatusE).

The membrane flip-flop 58 is initialized either with the arrival of the signal Load_Zygote, or with the arrival of the code <status=4> (indicating a membrane cell, see Table 2). The OR logic gate 57 makes it possible to carry out this function.

The membrane code CM=0 characterizing the zygote cell is established directly by the line Load Zygote (FIG. 3A).

The other membrane codes all require the presence of the membrane creation signal <Status=4>. The AND logic gates 50 to 56 make it possible to generate the commands CM=1 to CM=7, as indicated in FIG. 3A.

To create the various values of the membrane code, the following table may be drawn up:

TABLE 3

| | | | |
|---|---|---|---|
| CM = 0 | if Load_Zygote | | |
| CM = 1 | if <status = 4> | AND 1 < x < δx | AND y = 1 |
| CM = 2 | if <status = 4> | AND x = δx | AND y = 1 |
| CM = 3 | if <status = 4> | AND x = δx | AND 1 < y < δy |
| CM = 4 | if <status = 4> | AND x = 1 | AND 1 < y < δy |
| CM = 5 | if <status = 4> | AND x = 1 | AND y = δy |
| CM = 6 | if <status = 4> | AND 1 < x < δx | AND y = δy |
| CM = 7 | if <status = 4> | AND x = δx | AND y = δy |

These signals serve to establish the binary value of the membrane code loaded into the flip-flops 62, 63 and 64 by virtue of the OR logic gates 59, 60 and 61.

The status code forming the first part of the code words of the genome is used to assign the cells their status, namely especially if they are outside the functional organ, belong to the latter's membrane or form part of the cells situated within the organ itself. FIG. 3A diagrammatically illustrates an example of the way in which the sequencer 4 can generate the status code with the help of the signals for generating the membrane code. These signals, alone or in combination by virtue of the logic gates 65 to 76, allow the generation of the new status codes required for the growth of the organ. For this purpose, the signals StatusN ="..." and StatusE="..." make it possible, at the time of transit of the status code word of the genome through the shift register 1, to set the corresponding status code in order to dispatch it to the North and East cells.

The status code present in the code word is thus replaced with this new value in order to allocate to the cell, which will subsequently receive this code word, its status with respect to the organ undergoing growth.

Figure 8:
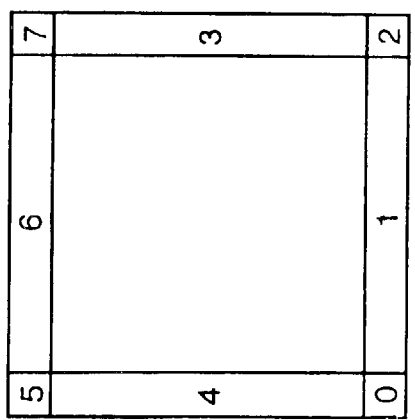
FIG. 8 is a sketch showing the distribution of a membrane code in the cells of an organ which is to be created in the network according to the invention.

FIG. 8 summarizes those membrane cells of the organ O respectively assigned the membrane codes CM. It may be seen that the zygote retains its 0 code, the South membrane cells have a membrane code 1, the membrane cell of the South-East corner has the code 2, the East membrane cells have the code 3, the West membrane cells have the code 4, the membrane cell of the North-West corner has the code 5, the North membrane cells have the code 6 and, finally, the North-East membrane cell the code 7.

It is obvious that these assignments of the value of the membrane code are given merely by way of example.

Figure 9:
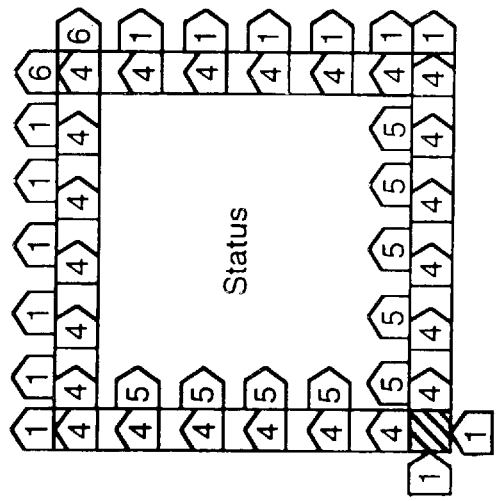
FIG. 9 is a sketch showing the distribution of a status code in the cells of the organ to be created.

FIG. 9 summarizes, for all the cells of the organ, what will be the status code, replace in the course of the growth of this organ, of the relevant cell. This replacement is carried out according to Table 4 below (also given purely by way of illustration):

TABLE 4

| Membrane code | <Status code> East neighbor | <Status code> North neighbor |
|---|---|---|
| 0 | 4 | 4 |
| 1 | 4 | 5 |
| 2 | 1 | 4 |
| 3 | 1 | 4 |
| 4 | 5 | 4 |
| 5 | 4 | 1 |
| 6 | 4 | 1 |
| 7 | 6 | 6 |

FIG. 9 thus shows that certain values of the status code in each code word have the following meanings:

| | |
|---|---|
| <status 1> = | genome header |
| <status 4> = | growth of a membrane |
| <status 5> = | interior of the organ |
| <status 6> = | membrane growth terminated. |

Once the zygote has been loaded, the local address computation is initialized. This is carried out by initializing to "1" the local address registers 9 with the signal Load_Zygote controlling the multiplexers 33 and 34 (FIG. 3). Address computation is kept effective over the whole area of the membrane by the signal Load_MHC generated by the OR gate 35 (FIG. 3b) from the signal Load_Membrane (output from the AND gate 91), the signal Load_Interior (output from the AND logic gate 93) and the signal Load_Zygote. The signal Load_MHC makes it possible to activate the loading element 36 in order to load the registers 9 storing the local address.

The local addresses are assigned to the cells, in principle, in the same way as described above in respect of the assigning of the global addresses, at least as regards the cells which meet the following conditions:

Status code = <status 5>
M=1 AND CM=6 (North part of the membrane)
M=1 AND CM=3 (East part of the membrane)
M=1 AND CM=7 (North-East corner of the membrane).

The other cells (South edge of the organ and West edge of the organ) are processed like the cells situated on the South and West edges of the network. During the global address computation, they receive the corresponding values incremented in accordance with the value borne by the SouthEdge and WestEdge lines steering the multiplexers 13 and 16.

SouthEdge = SouthEdge_Network OR SouthEdge_Organ
WestEdge = WestEdge_Network OR WestEdge_Organ
SouthEdge_Organ = (M=1) AND (CM=4) OR (CM=5)
WestEdge_Organ = (M=1) AND (CM=1) OR (CM=2).

Block M5 with local address δx includes two comparators 37 and 38 which, together with the AND gate 39, make it possible to generate the signals x=1, 1<x<δx, and x=δx which are used for generating the membrane code.

Block M6 with local address δy also includes two comparators 40 and 41 which, together with the AND gate 42, make it possible to generate the signals y=1, 1<y<δy, and y=δy which are used for generating the membrane code.

FIGS. 10 to 14 illustrate the growth of the organ 0 starting from the zygote with global address 1,1 according to the genome indicated in Table 1 above. In each figure, the state of the signals and codes in the cell has been represented so as to illustrate the state thereof.

Figure 10:
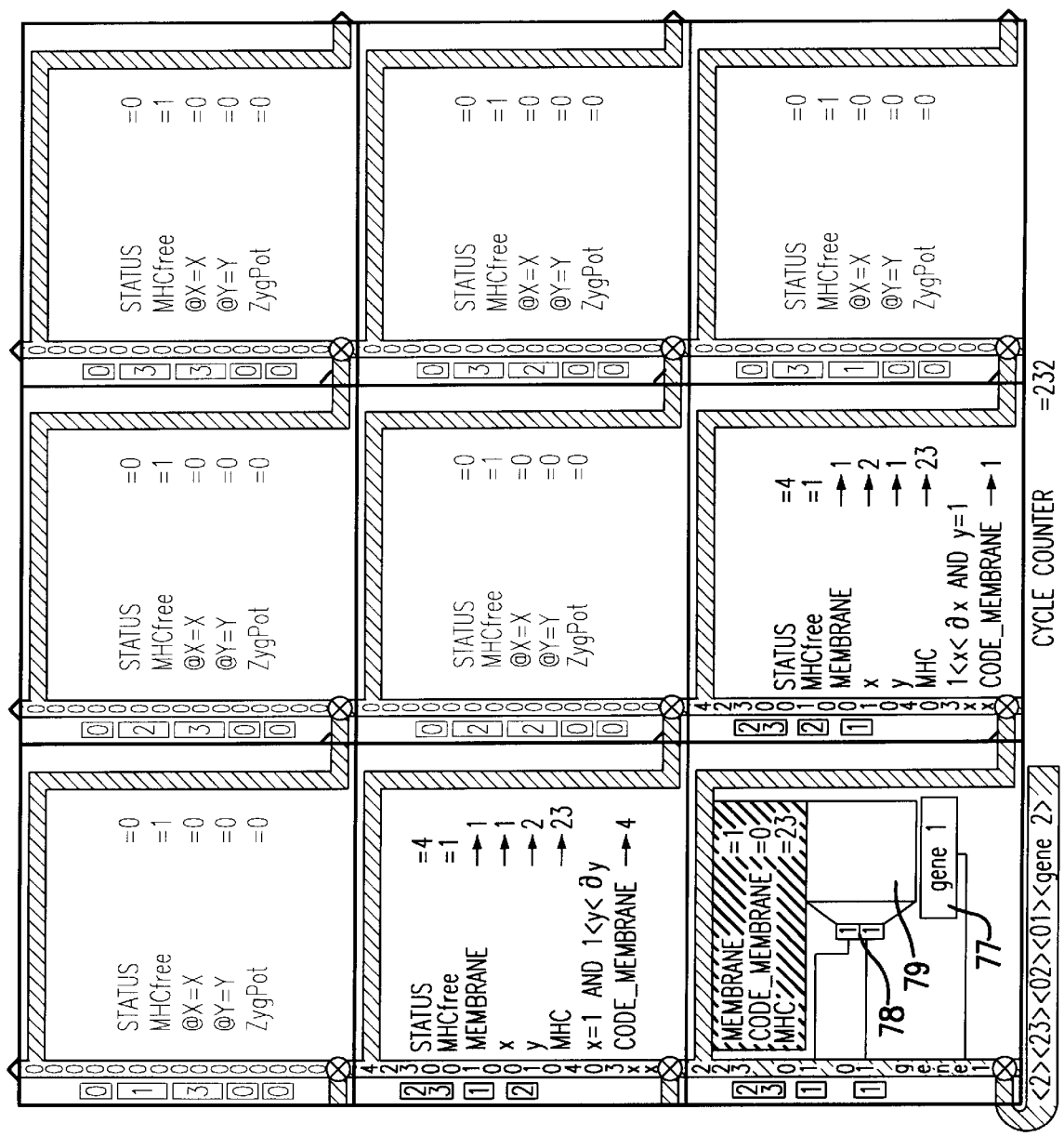
FIGS. 10 to 14 show the growth of the functional organ after respectively 232, 290, 348, 406 and 464 cycles of the base clock controlling this growth.

In FIG. 10, the zygote contains code word No. 2, whilst the cells with global address 1,2 and 2,1 have received code word No. 1 in which the status code has been modified from 1 to 4 by the loading elements 21 and 22, on the basis of the memories of constants 23 and 24 (FIG. 3), of the zygote. The other cells are still inactivated having still received no code word. It will be noted that the status code 4 henceforth assigns the membrane cell status to the cells with address 1,2 and 2,1. The cycle counter in each of the cells now displays 232. The first gene of the genome is placed in the register 77 of the zygote. The decoder 78 is loaded with the local addresses of the gene δx and δy. The contents of the register 77 are then loaded into memory 79, by virtue of the signal Load_genome supplied by the AND gate 98 (FIG. 3B).

Figure 11:
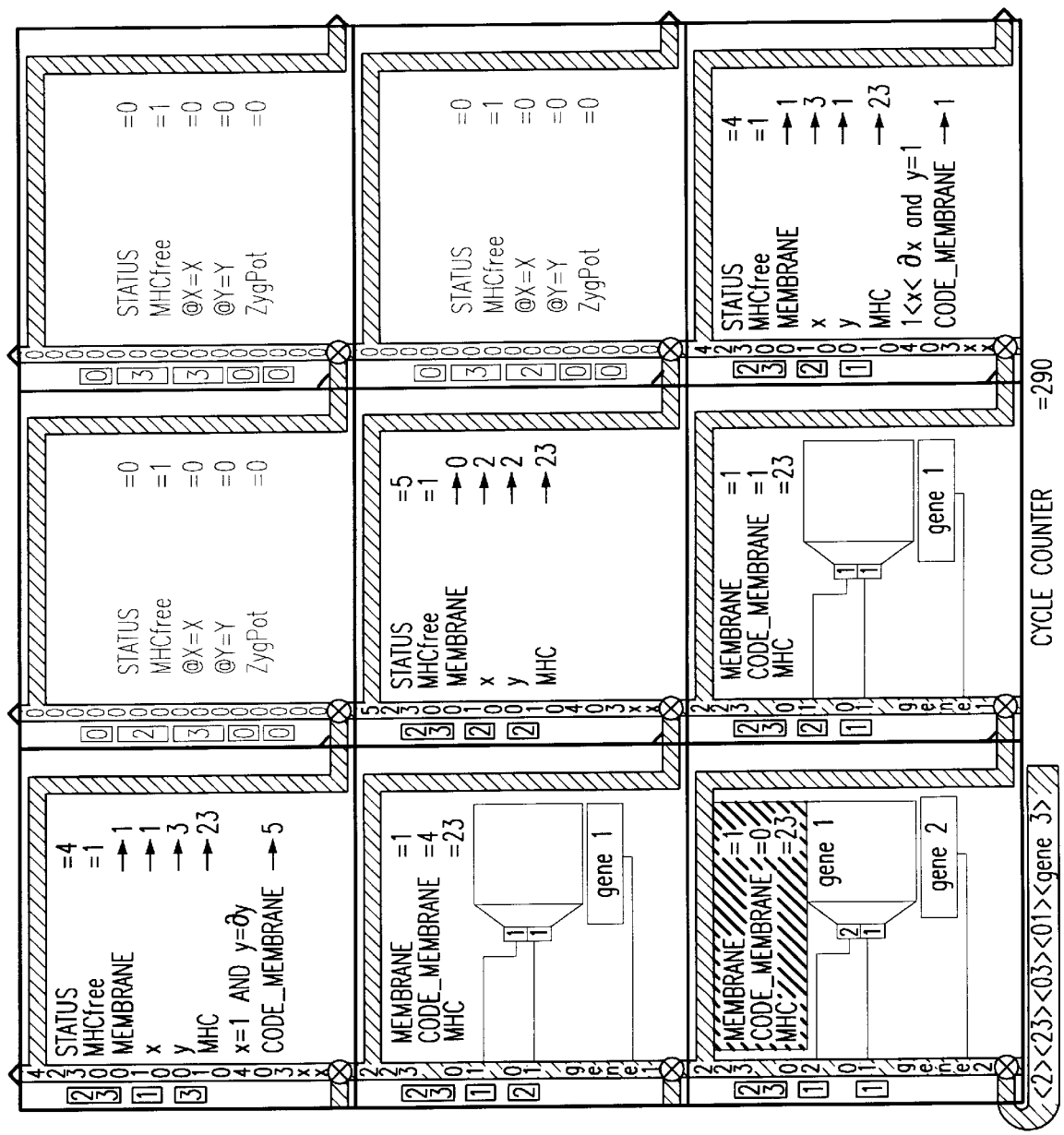

In FIG. 11, the cell cycle counters display 290. Codeword No. 3 is input into the zygote. The cells with address 1,3 and 3,1 have had their status code changed to <status 4>, whilst for the cell with address 2,2 this status code has been changed to <status 5>. The latter cell therefore becomes a cell internal to the organ O.

Figure 12:
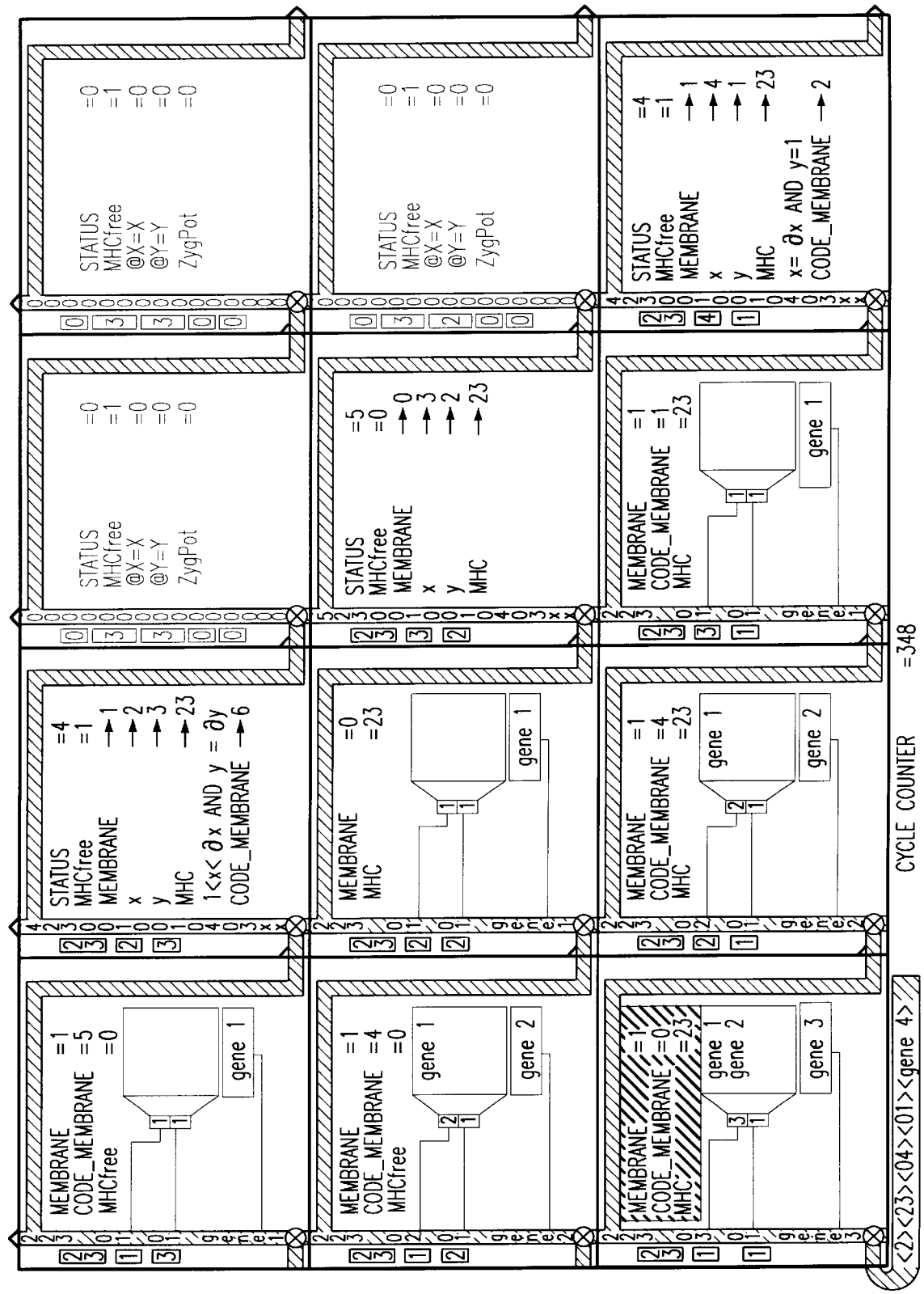
Figure 13:
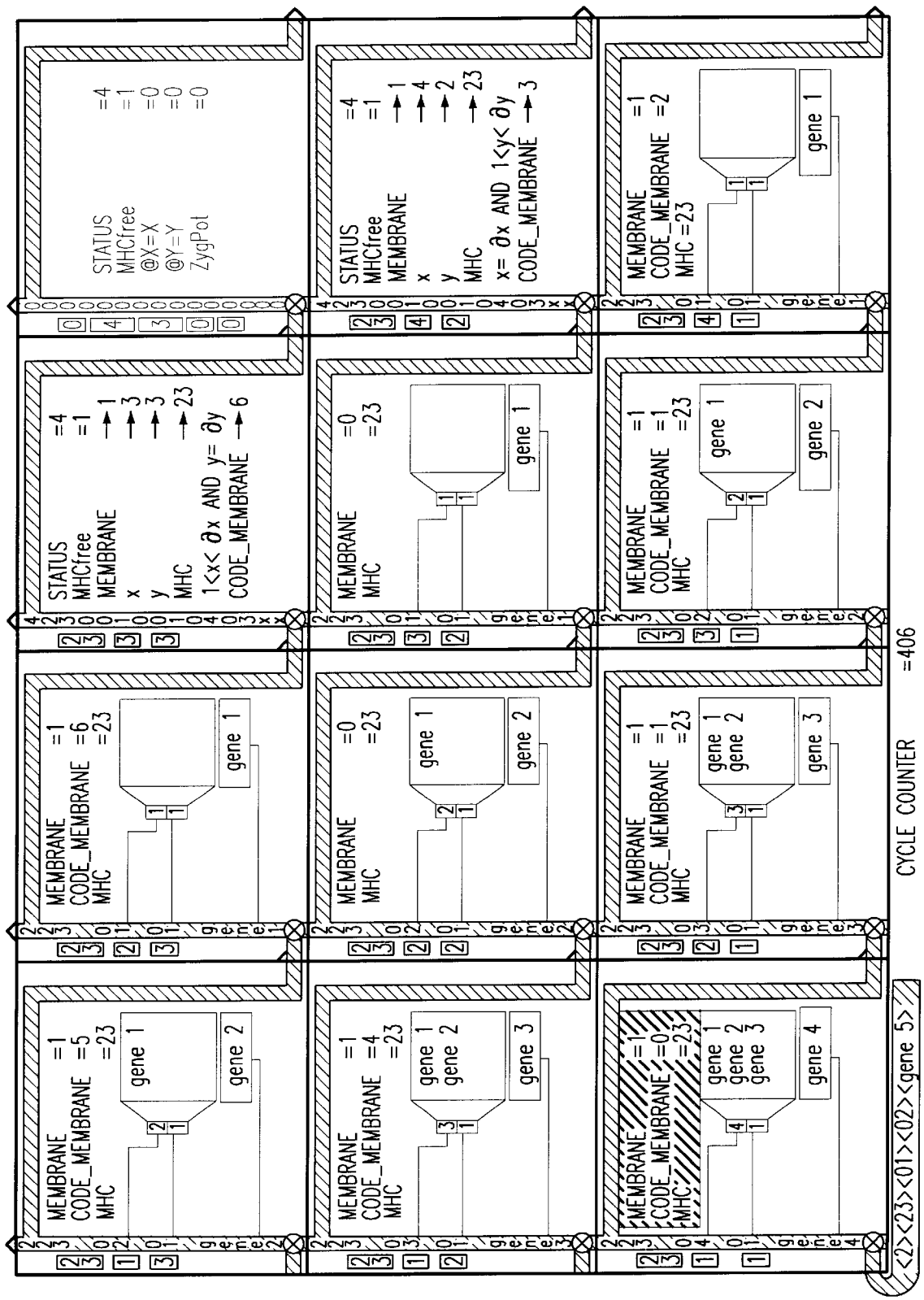
Figure 14:
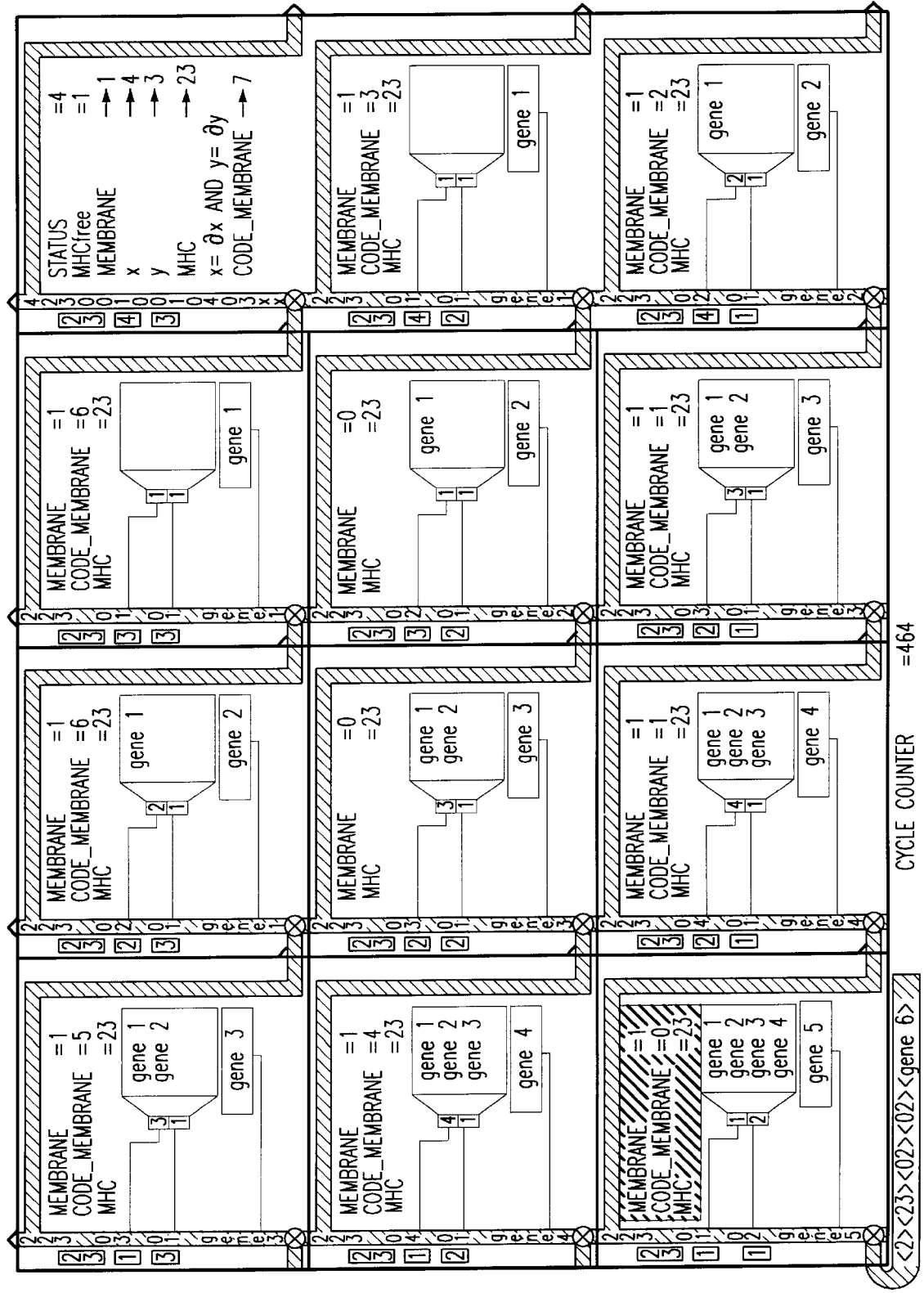

FIGS. 12, 13 and 14 show the situation after 348, 406 and 464 cycles respectively of the base clock of the processor P, FIG. 14 representing, as regards the zygote, transit of gene No. 5.

The growth of the organ O continues in this way until code word No. 1 reaches the extreme North-East cell of the organ O.

Figure 15C:
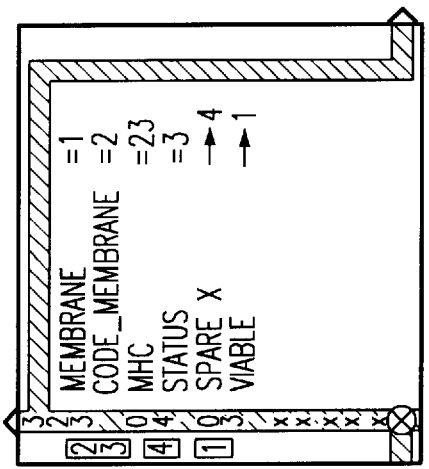
Figure 15A:
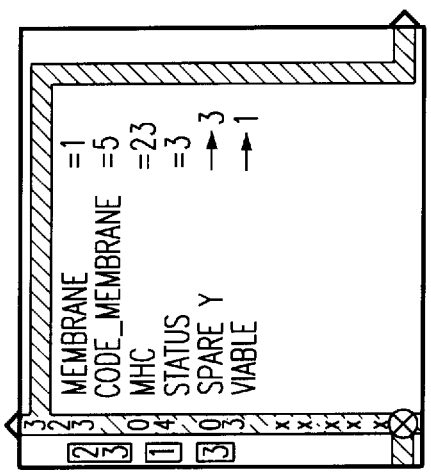
Figure 15A:
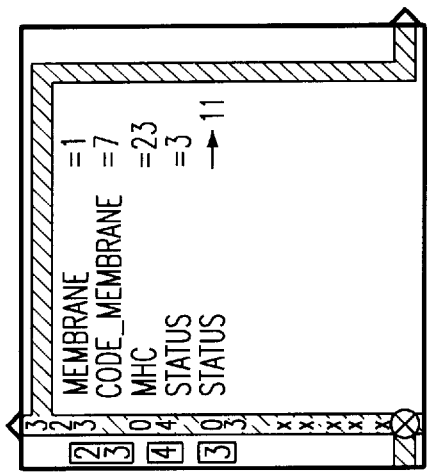

However, the extreme cells, South-East (address 4,1) with membrane code CM=2, North-West (address 1,3) with membrane code CM=5 and North-East (address 4,3) with membrane CM=7 undergo a particular operation as represented in FIGS. 15A, 15B and 15C, by virtue of the particular form of code word No. 14 of the genome whose status code is <status=3>. When the final code word No. 14 arrives in the cell in the South-East corner of the membrane, the code SPAREX of the code word is loaded into a register SPAREX of the cell. Loading is controlled by the AND gate 43a whose inputs are the signals END_genome (<Status=3>) and the signal CM=2. As long as the part with local address X of this cell is less than (or equal to) the contents of the register SPAREX, a signal VIABLE=1 is activated by the comparator 46.

If the cell is that corresponding to the North-West corner (CM5) the register SPAREY carries out the same function. Loading is controlled by the AND gate 43b whose inputs are the signals END_genome (<Status=3>) and the signal CM=5. As long as the part with local address δy of this cell is less than or equal to the contents of the register SPAREY, a signal VIABLE=1 is activated by the comparator 48.

It should be noted that, in the example described, the code SPARE is merged with the local address of the last cell of the organ O. However, this code can be used to reserve a certain number of cells as reserve cells capable of replacing, as appropriate, defective cells.

These signals VIABLE (which may be differentiated in terms of X and Y) are used when "taking the temperature" (code <status=10>) to supply an indication of the state of the reserves. The AND gates 44 are then used to copy the registers SPARE into the shift register instead of the registers δX and δY. The loading elements 45 and 47 are used for these operations.

When loading an organ, it is judicious to provide an excess of cells intended to replace any functional cell which may become faulty. Such replacement is managed by the fault management circuit 7 and can be performed as indicated in the aforementioned patent application. Moreover, as indicated previously, it is possible to ascertain the remaining number of cells in excess. This number is associated, in the present description, with the "temperature" of the organ, which is a cue transmitted to the processor P.

If the cell is located in the North-East corner the status code is changed in code word No. 1 so as to take the value 6, this signifying the end of the growth of the organ O.

Various problems (faults, errors, etc.) may occur when loading an organ or when using the system. The latter is equipped with means for dealing with these problems.

Such is the case when the potential zygote is already occupied. The loading of the organ cannot then be performed. The gate 90 produces the signal <code_error=1> from the signal Start_Zyg generated by the AND gate 31 (FIG. 3B), and from the signal MHCfree=0 (which signifies that the cell is already occupied).

A second case arises when the growth of the membrane encounters a cell which is already occupied. The loading of the organ cannot then be performed. The gate 92 produces the signal <code_error=2> from the signal Membrane (<Status=4>) and the signal MHCfree=0 (which signifies that the cell is already occupied).

A third case arises when the growth of the organ (interior this time) encounters a cell which is already occupied. The loading of the organ cannot then be performed. The gate 94 delivers the signal <code_error=3> from the signal Interior (<Status=5>) and the signal MHCfree=0 (which signifies that the cell is already occupied).

The various error signals (<code_error=1> to <code_error=3>) form the inputs of an OR gate 71 (FIG. 3A) whose output is the code <Status=8 > (North and East). This signal is used to modify the status code.

This error code is also used to activate a multiplexer which makes it possible to select the error code constant stored in the memory 81 and to load it instead of the code word (gene) by virtue of the signal <Status=8> controlling the loading element 80.

There is a still more serious defect mode, this being a fault in a cell of the membrane; whether it be during loading or during use. Detection of this case is obtained via the OR gate 95 (FIG. 3B) whose inputs are Load_Zygote, Load_Membrane, and the output from the flip-flop M58 (FIG. 3A). The output from this gate 95 forms an input to the AND gate 96 whose second input is the fault signal originating from the fault management block 7 (FIG. 2). The output of this AND gate 96 is connected directly to the "set" input of a flip-flop 97 termed Major_fault. This flip-flop is triggered on a global row signal and a global column signal in order to indicate the major fault. The processor P then undertakes reconfiguration of the organ, as indicated above.

The output signal from the Major_fault flip-flop 97 is also used to provide a report of the fault (as well as of the location at which the problem occurred). For this purpose, it is combined, in the gate 72, with the empty signal (<status=0>), which indicates that the shift register 1 is free, in order to transmit a status code (<Status=9>) destined for the processor P, via the North and East neighbor cells. This constant of the error code allows, for example, the processor P (or any other special-purpose organ) to recommence the loading of the organ by modifying, for example, the global address of its zygote.

It is clear that the exchange of functional signals between the organs, such as the output signals from the programmable functional part 6, can be performed by membrane cells when the organs are adjacent or by specially dedicated organs (connection organs) linking disjoint organs.

Moreover, it is quite obvious that the present invention can also be applied to networks having a more complex hierarchy. Thus, networks can be envisaged which include different organisms, each consisting of several different organs.

We claim:

1. A matrix network (R) composed of cells (Cx,y) all of identical construction and in which network each cell is assigned a code word which defines its function which it is to provide for within the network (R), said network including means (1) which, with a view to the configuring of the cells (Cx,y), iteratively cause the translation into each of said cells of a genome formed of a train of said successive code words, wherein it comprises at least one individualized functional organ (O1, O2, O3, ...) composed of a plurality of said cells which are all characterized by a same first predetermined code (<MHC>) forming part of said code word and formed by a number identifying said organ (O1, O2, O3, ...) and are organized in such a way as collectively to provide for the functionality of said organ, said cells of the organ being distributed as a first group of so-called internal cells defined by a first predetermined value (<status=5>) of a second code or status code also forming part of said code word, and a second group of so-called membrane cells defined by a second predetermined value (<status=4>) of said second code, said first group of cells providing for the functionality of said organ and said second group of membrane-forming cells (MO1, MO2, MO3, ...) being capable of functionally isolating said first group of cells from the remainder of the network and providing for the communication of this first group of cells with the remainder of said network (R).

2. The matrix network as claimed in claim 1, wherein said internal cells are configured so as to form in said organ (O1, O2, O3, ...) a first set of cells providing for the functionality of this organ and a second set of cells configured so as to be reserve cells (code SPARE), each cell (Cx,y) also comprising means (7, 90 to 99) for generating a fault signal in the event of the malfunctioning of this cell, and means for, in response to said fault signal, replacing the faulty cell with a cell taken from said set of reserve cells.

3. The matrix network as claimed in claim 2, wherein each cell also comprises means (SPARE registers) for allowing a counting of the remaining number of cells available in said set of reserve cells and for generating an alarm cue modifying in said genome said second code assigned to the relevant cell (<status=10>) depending on the result of this counting.

4. The matrix network as claimed in any one of claims 1 to 3, wherein each cell is equipped with means (8) for storing a global address (@X, @Y) defining its location in said network (R), and address comparison means (M3, M4) for generating an identification signal (ZygPot) when, during the transfer of said genome, a code word contains address values identical to those of the global address stored in said cell, said signal being capable of initiating the configuring of said relevant cell as a zygote of a functional organ (O1, O2, O3, ...).

5. The matrix network as claimed in claim 1, wherein each cell includes means (20) for analyzing said second code (<status>) of the code words of which said genome is composed and means (4, 20a, 20b, 21, 22, 23, 24) for modifying said second code in the code word which is present in the relevant cell, so as to transmit a modified status code cue downstream in said network during the transfer of said genome, either to at least one other cell, or to a general processor (P) managing the operation of said network.

6. The matrix network as claimed in claim 4, each cell includes means (20) for analyzing said second code (<status>) of the code words of which said genome is composed and means (4, 20a, 20b, 21, 22, 23, 24) for modifying said second code in the code word which is present in the relevant cell, so as to transmit a modified status code cue downstream in said network during the transfer of said genome, either to at least one other cell, or to a general processor (P) managing the operation of said network, and wherein each cell further includes means (M5, M6) capable of analyzing an organ size cue ($\delta X$, $\delta Y$) contained in at least some of the code words of said genome, when said zygote or a cell situated upstream with respect to the relevant cell during the transfer of said genome but downstream with respect to said zygote, transmits said second modified code to the relevant cell, and means (50 to 76) for, depending on said analysis, configuring themselves as a membrane cell (<status=4>) or functional cell (<status=5>) of said organ.

7. The matrix network as claimed in claim 6, wherein each cell includes means (12) for allowing a redundant computation of address of said cells (Cx,y) in cross directions of the matrix of said network.

* * * * *